United States Patent [19]

Davis

[11] Patent Number: 4,827,272

[45] Date of Patent: May 2, 1989

[54] OVERHEAD POWER LINE CLAMP AND ANTENNA

[76] Inventor: Murray W. Davis, 19790 Eastwood, Harper Woods, Mich. 48225

[21] Appl. No.: 945,189

[22] Filed: Dec. 23, 1986

Related U.S. Application Data

[63] Continuation of Ser. No. 616,945, Jun. 4, 1984.

[51] Int. Cl.$^4$ .............................................. G01R 1/22
[52] U.S. Cl. .................................. 343/702; 324/127; 340/870.17; 343/720
[58] Field of Search ............... 343/703, 793, 702, 720, 343/894; 324/126, 127, 129, 133, 149; 340/870.17, 870.38; 339/109, 264 R, 264 L; 439/479

[56] References Cited

U.S. PATENT DOCUMENTS

| | | | |
|---|---|---|---|
| 2,009,289 | 7/1935 | Caird | 339/109 |
| 2,013,241 | 9/1935 | Hefner | 324/133 |
| 2,828,413 | 3/1958 | Bowers | 343/702 |
| 3,375,510 | 3/1968 | Pitches | 324/133 |
| 3,453,544 | 7/1969 | Schweitzer | 324/127 |
| 3,750,180 | 7/1973 | Fujimoto et al. | 343/788 |
| 4,384,289 | 5/1983 | Stillwell et al. | 340/870.17 |
| 4,635,055 | 1/1987 | Fernandes et al. | 324/127 |

FOREIGN PATENT DOCUMENTS

| | | | |
|---|---|---|---|
| 1076648 | 4/1980 | Canada . | |
| 46-10741 | 3/1971 | Japan | 324/127 |

Primary Examiner—William L. Sikes
Assistant Examiner—Michael C. Wimer
Attorney, Agent, or Firm—Cullen, Sloman, Cantor, Grauer, Scott & Rutherford

[57] ABSTRACT

A clamp and antenna for an overhead power line conductor includes a C shaped housing having upper and lower jaws movable relative to each other for securing the clamp to the overhead power line. A power supply is positioned in the housing and is energized by current following through the power line. A transmitter, powered by the power supply, transmits data using a portion of the housing as an antenna. The antenna provides a guide for an actuator for moving the jaws of the housing relative to each other.

19 Claims, 2 Drawing Sheets

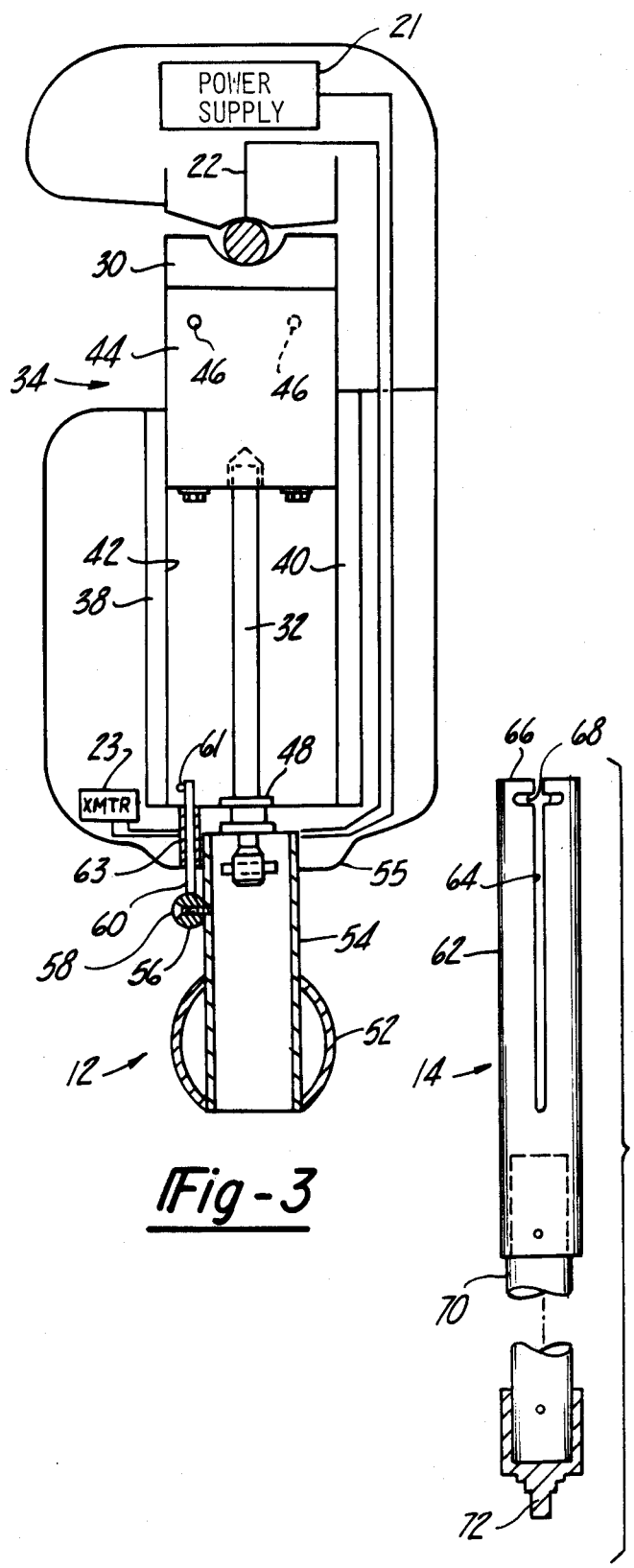
Fig-3
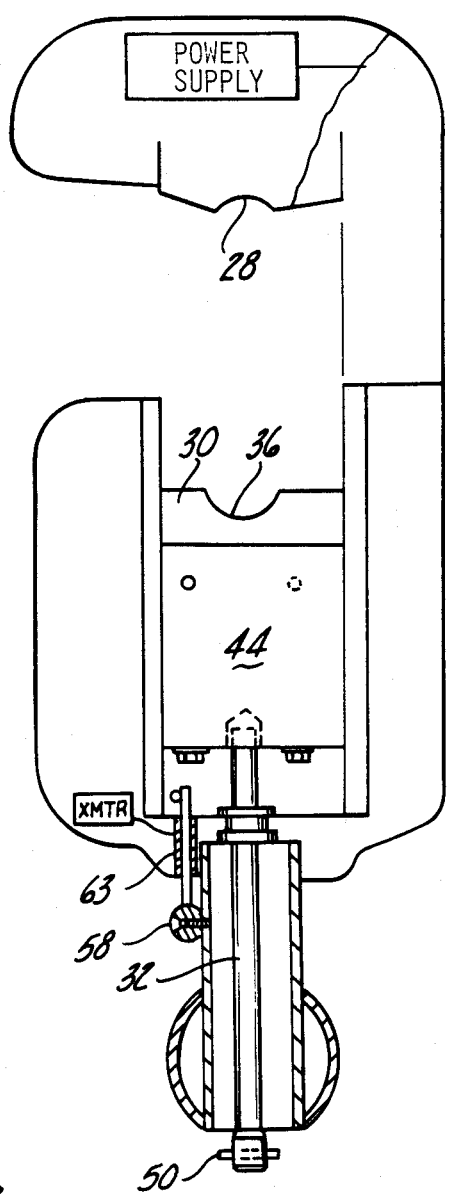
Fig-4
Fig-5

OVERHEAD POWER LINE CLAMP AND ANTENNA

This is a continuation of co-pending application Ser. No. 616,945 filed on June 4, 1984.

BACKGROUND OF THE INVENTION

This invention relates to a real-time parameter sensor-transmitter system such as the type disclosed in Davis et al U.S. Pat. No. 4,268,818 issued May 19, 1981 and Davis et al U.S. Pat. No. 4,420,752 issued Dec. 13, 1983. Each of these patents is hereby incorporated by reference. As described in greater detail in each of those patents, it is desirable to monitor at least one parameter of an energized electrical power line conductor, or at least one parameter adjacent to the conductor, on a real-time basis and transmit signals indicative of the parameter to a remote location. Monitoring parameters enables electrical utility companies to maximize their use of overhead power lines by safely approaching the maximum current carrying capacity of the power lines.

The present invention is directed to a new and improved housing which maybe removably clamped to an overhead power line. The housing may include one or more sensors, a transmitter for transmitting data indicative of the parameter to a remote location, and a power supply preferably energized by the current in the overhead power line. Since the parameter data is being transmitted to a remote location, the housing includes an antenna and, according to the principles of the present invention, the antenna provides a guide for an actuator means which is used to clamp and release the housing from the power line.

SUMMARY OF THE INVENTION

The present invention provides a clamp and housing which is an improvement over the housing described in the above-mentioned U.S. Patents which provides numerous benefits including the ability to be easily attached to and removed from an overhead energized power line conductor. The housing includes upper and lower jaws movable relative to each other to enable the housing to be securely attached to the power line conductor.

The present housing includes an antenna which provides the dual function of not only being an antenna but also providing a guide for an actuator means which opens and closes the movable jaws of the housing.

BRIEF DESCRIPTION OF THE DRAWINGS

The various features, benefits and advantages of the present invention will become more apparent upon reading the detailed description of the invention taken in conjunction with the drawings. In the drawings, wherein like reference numerals identify corresponding components:

FIG. 3 is a side elevation view of the housing and antenna with one of the two C-shaped members removed and with the lower jaw in the engaged position;

FIG. 4 is a side elevation view as in FIG. 3 but illustrating the lower jaw in the retracted position; and FIG. 5 is an illustration of a portion of the actuator means.

DETAILED DESCRIPTION OF THE INVENTION

Figures 1, 2:
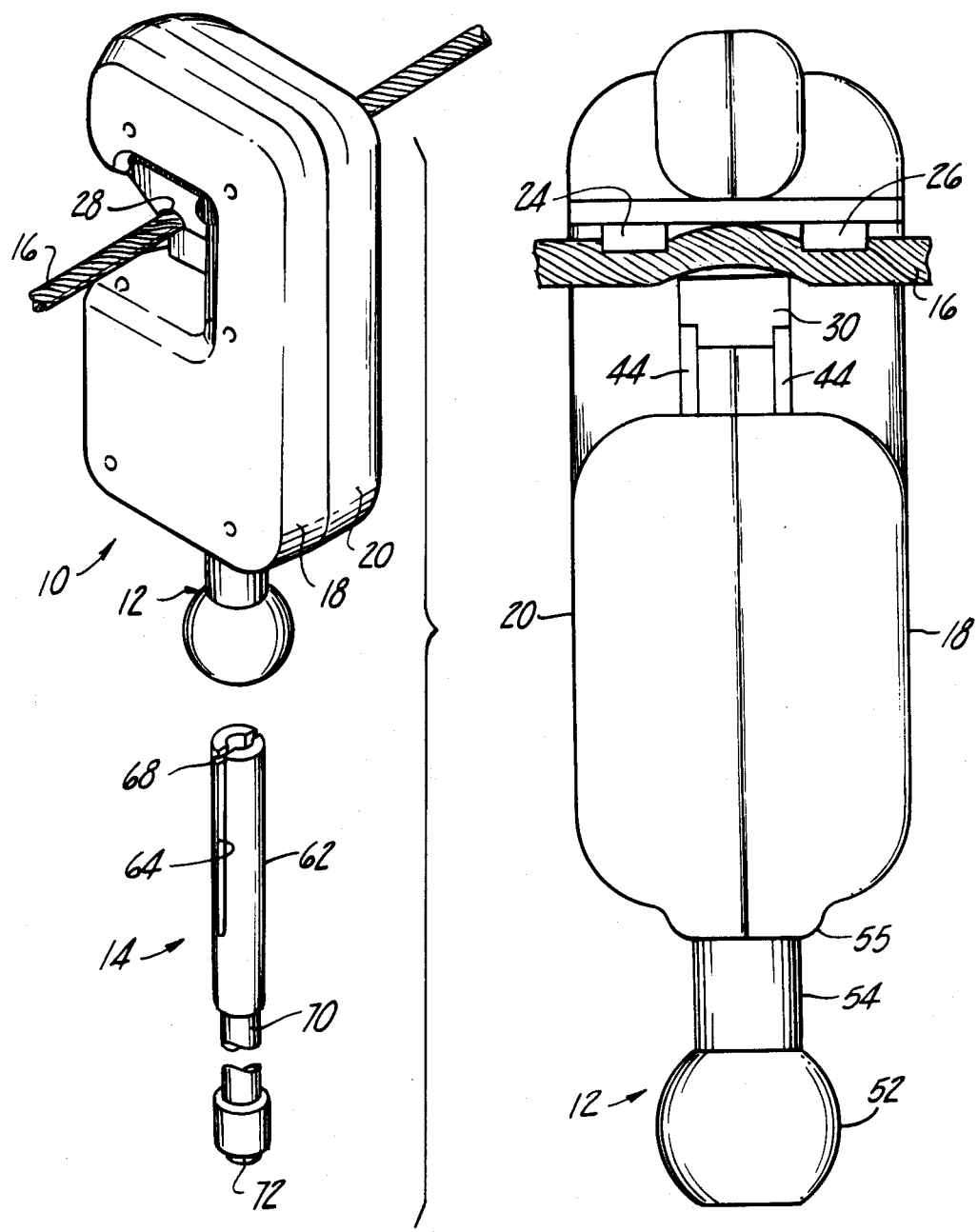
FIG. 1 is a perspective illustration of the housing, clamp, antenna and the actuator means, with the clamp positioned on a power line conductor.
FIG. 2 is a front view of the clamp, housing and antenna of the present invention.

With reference to the drawings, the present invention is illustrated including a housing 10 having an antenna 12 and an actuator means 14 for opening and closing the clamp of the housing on an overhead power line conductor 16. The conductor is typically of the stranded type and is suspended between utlity poles or towers. The housing includes two C-shaped housing members 18, 20 secured together by bolts or the like.

As described generally in the prior U.S. Patents referred to above, various electronic components of a system of the type for which the present housing is utilized may be mounted inside. Illustrated diagrammatically in FIG. 3 is a power supply 21, a sensor such as a temperature probe 22 and a transmitter 23, all electrically coupled together. The housing protects the electronics from severe environmental conditions and from high electric and magnetic fields of the overhead power line. The housing is at the same electrical potential as the conductor and is free from producing corona and therefore eliminates the problem of causing audible noise, radio and television interference and the like at the high transmission line voltages.

One of the features of the present invention is that it may be easily installed on power line conductors, because of the unique jaw including a movable jaw mechanism, and may be installed safely even though the power line conductor 16 is energized. The antenna 12 mounted at the bottom of the housing includes a corona free hollow sphere and the antenna serves as a guide for the actuator means 14. As will be described the actuator means physically supports the housing while the housing is being placed on or removed from the conductor.

The clamping feature of the present invention will now be described with reference to FIGS. 1, 2 and 3. The upper portion of the C-shaped housing members includes a pair of fixed upper jaws 24, 26 each of which are provided with a downwardly concave curved recess 28 to accommodate the curvature of the conductor 16. The upper jaws 24 and 26 are spaced apart and the housing may be lifted onto the conductor and then lowered such that the conductor fits within the recesses 28 within each of the upper jaws 24, 26. The recesses aid in guiding the conductor into its final position within the upper jaws. Once the housing is positioned with the upper jaws 24, 26 on the conductor, the movable lower jaw 30 is engaged as will be described in greater detail to clamp the jaws onto the conductor.

As indicated previously, the housing 10 includes two C-shaped halves 18, 20, held together with a plurality of bolts. The outside surface of the halves have been designed to eliminate sources of corona and may be formed using alternative electrically conductive materials and techniques such as formed from sheet aluminum with deep draw dies or formed from a zinc and aluminum alloy using a die casting process. The preferred material is 356-T6 aluminum alloy castings which are burnished or vapor blasted to ensure a smooth corona-free surface and thereafter anodized to reduce oxidation. This particular aluminum alloy provides high strength and is light weight.

In order to explain some of the benefits of the unique clamping system of the present invention, various phenomenon of clamping a device to a stranded power line should be understood. When a clamp-type device is attached to a stranded power line conductor, and thereafter current flows through the conductor, three phenomena occur as the conductor is thermally cycled. First, the metal in the strands of the conductor, in response to the clamping force, tends to flow into the voids or air spaces between the strands themselves. Second, the fastening mechanism utilized to secure the clamp members to the conductor, such as bolts or the like, tends to elongate over time causing the clamp halves to relax on the conductor. Third, when a steady state current is applied to the conductor, the conductor temperature increases to a value above ambient temperature, due partially to the internal heat generated within the conductor, and the conductor begins to sag from its original position to a lower position since the length of a conductor increases due to thermal expansion. A power line conductor of the type utilized by electrical utility companies may include a steel reinforced core having aluminum strands wound therearound. Since the thermal expansion of the steel core is less then the thermal expansion of the aluminum strands, the aluminum strands will tend to unwind from the steel core. At the point where there is directed contact between the clamp and the stranded conductor, the strands are restricted from moving but the strands just adjacent to the clamp edges are free to unwind as their length increase due to thermal expansion. Whether the clamp is carrying current or not, the prior art clamp serves as a heat sink for the conductor and thus the strands in direct contact with the clamp are a lower temperature than the strands in the remaining portion of the conductor. As a result, the aluminum strands adjacent to the clamp tend to spread out radially, a phenomenon known as bird-caging, and the outside layer of strands are fretted by the clamp until these strands become broken.

In the present invention, since the jaws are made of a thermally insulating material, the jaws do not function as a heat sink for the conductor thus allowing the conductor 16 to thermally cycle without bird-caging. Furthermore, the temperature sensor 22 is able to measure the undisturbed conductor temperature. The upper jaws are each about 1.5 inches long in an axial direction, i.e., the direction parallel to the elongated axis of the conductor 16, and there is one lower jaw 30 which is about two inches long in an axial direction. The adjacent edges of the two upper jaws 24, 26 are more than two inches apart. When the housing 10 is placed on the conductor, the two spaced apart upper jaws 24, 26 support the weight of the housing. The generally cylindrical recess 28 in the upper jaws also hold the housing in place and prevent the entire housing 10 from rotating about any axis perpendicular to the axis of the conductor, while the actuator means tightens the jaws against the conductor. The housing is clamped onto the conductor by turning a lead screw 32 of an opening and closing mechanism 34 in an clockwise direction until the lower jaw 30 is secured to the underside of the conductor. The lower jaw 30 is provided with an upwardly concave recess 36 to accommodate the exterior curvature of the conductor.

One of the unique features of the present invention is that the conductor is held at the top with two spaced apart jaw and at the bottom with a lower jaw, which is centered relative to the two upper jaws and narrower in an axial direction then the spacing between the two upper jaws, thus causing the conductor to be forced into a slight downward concave configuration in the region between the three jaws. The conductor does not take a permanent set from the jaws but rather acts like a spring which compensates for the difference in thermal expansion between the lead screw 32 and the housing 10. Since the upper and lower jaws create a moment on a small section of the conductor, the housing can not slide or swing back and forth along the conductor axis. Furthermore, the structure and positioning of the jaws minimize the bird-caging effect referred to earlier, because the temperature of the strands in contact with the jaws is essentially the same as the temperature of the strands adjacent to the clamp. This is accomplished in two ways—offsetting the clamps axially, thus providing as much air space as possible around the conductor, thus not impairing thermal convection around the conductor, and by tending to minimize the area of the jaws in contact with the conductor, of course, with the jaws being of a material of low thermal conductivity, i.e., thermally insulating. The upper jaws provide maximum contact with the conductor through an arc of less than 120 degrees and the bottom or lower jaw 30 provides maximum contact with the conductor through an arc of less than 120 degrees. This permits maximum surface area of the conductor to be exposed to ambient air.

FIG. 3 illustrates the lower jaw 30 in the uppermost position and FIG. 4 illustrates the lower jaw 30 in the lowermost position. Means are provided for moving the lower jaw 30 between the uppermost and lowermost positions—the lowermost position allows the conductor to enter the open portion of the C-shaped housing halves 18,20 during installation while movement toward the uppermost position is to effect a clamping action on the conductor.

As illustrated in FIG. 3, with one cover of the C-shaped housing half 18 removed, a pair of aluminum guides 38, 40 extend from the top to the bottom of the lower half of the C-shaped housing. These aluminum guides are spaced apart such that the opening and closing mechanism 34, which supports the lower jaw 30 and lead screw, may move vertically within the guides. The guides may each be provided with a low friction track 42. One end of the opening and closing mechanism 34 is journalled on one end of a threaded lead screw 32 which lead screw rotates within a lead screw nut as will be explained. Rotation of the lead screw causes the opening and closing mechanism 34 to move vertically within the track 42 of the aluminum guides 38, 40 thereby moving the lower jaw toward or away from the upper jaws 24, 26.

The opening and closing mechanism 34 includes clamp plates 44 (only one is illustrated in FIGS. 3 and 4) on oppite sides of lower jaw 30. These clamp plates support the lower jaw and the clamp plates are spaced apart providing an open air space therebetween. The lower jaw is held in place on the clamp plates 44 by screws 46. The screws do not extend all the way through but rather one screw enters the front clamp plate into the jaw while the other screw is placed through the back clamp plate and into the jaw. The screw should not extend to both clamp plates, through the jaw, because to do so would provide an undesirable short circuit electrical path.

As mentioned previously, one end of the lead screw 32 is connected to the opening and closing mechanism 34 and extends through an internally threaded lead screw nut 48 at the other end. The lead screw nut 48 has upper and lower flanges and fits within an aperture in the bottom of the C-shaped housing halves such that the lead screw nut 48 does not move relative to the housing. Thus upon rotation of the lead screw, the opening and closing mechanism 34 together with the lower jaw 30 move relative to the upper jaw. A machine screw or other conventional device may be provided to prevent the lead screw nut 48 from turning. The top of the lead screw is of reduced diameter and is journalled in the opening and closing mechanism 34. The bottom of the lead screw 32 is provided with an aperture to receive a transverse pilot pin 50 therethrough for connection to the actuator means as will be described hereinafter.

With reference to the drawings and particularly FIGS. 1 through 4 the antenna 12 will now be described. The antenna is mounted at the bottom of the C-shaped housing halves 18, 20 and is designed to transmit signals in the UHF band, i.e., 450–470 MHz. The antenna also forms a guide for the actuator means 14 so that the actuator means 14 may be used to rotate the lead screw 32. The antenna is essentially a one-half wave dipole grounded at the center. The antenna 12 includes a spun aluminum sphere 52 mounted at the lower end of a hollow aluminum pipe 54 and the sphere is welded to the lower end of the pipe 54. Thus the center of the driven element of the antenna is not half way down the aluminum pipe 54 but rather is at the antenna base 55. Since there is no RF voltage at the center of a half wave dipole antenna, and since the antenna base is grounded to the conductor 16 (i.e., is at the potential of the conductor) a standard coaxial lead from a transmitter would have its outer conductor grounded at the top of the antenna and its inner conductor, which carries the RF current, is tapped at the matching point out onto the driven element (the aluminum pipe 54). This is accomplished using a ⅜ inch bronze sphere or matching tap 56 secured to the pipe 54 by a screw 58.

An electrically conductive rod 60 (e.g., copper, aluminum, etc.) or matching arm is connected between the tap 56 and the interior of the housing 10, to be connected to the transmitter, and the inductance of the arm is tuned out as is conventional such as by the use of a tuning capacitor 61 positioned internally of the housing 10. The capacitor is in the low pF range and both the point of contact with the driven element and the value of the capacitor are adjusted for zero reflected power. The capacitor 61 is made variable until the antenna is tuned and then left as fixed value.

The arm is insulated frm the housing half by an insulating bushing 63. Since the RF current is high between the arm and the driven element, the matching tap is constructed from a bronze sphere 56 which attaches the arm to the driven element using a brass screw 58 so as not to create a source of corona. Because of the smooth shape of the matching tap and its close proximity to the antenna base, no corona sources are produced with this antenna matching system. At the bottom of the driven element or pipe 54 the use of the sphere 52 eliminates sources of corona.

This method of matching is based upon the fact that the impedance between any two points along a resonant antenna is resistive. The antenna length is first adjusted for approximate resonance, which for the UHF band is about 6.5. inches. The distance between the surface of the antenna and the arm was set at 0.25 inches to minimize corona. The matching tap is then adjusted up or down, while maintaining the same lateral distance from the antenna, until the standing wave ratio or SWR is as low as possible. When the series capacitor method of reactance compensation is used, various positions of matching taps are tried after the resonant length of the antenna is established. For each trial matching tap position, the capacitor is adjusted to achieve minimum standing wave ratio until the standing waves are reduced to the lowest value. The standing wave ratio or SWR for the antenna of the present invention is nearly 1:1.

This antenna possesses numerous advantages in that it is applicable to a broad range of UHF frequencies, it provides a horizontal, omnidirectional radiation pattern and is of rugged construction allowing the interior of the sphere and the interior of the aluminum pipe 54 to function as a guide for the actuator means 14. The antenna is corona protected and may be grounded at the power line frequency of 60 Hz.

The housing of the present invention is normally installed at the middle of the span of the power line conductor although it may be mounted anywhere along the transmission line or power line conductor. The actuator means utilized to open or close the clamp will now be explained. It should be understood that the housing of the present invention may be installed on the power line using the actuator means 14 with an installer either standing on the ground or on a pole or other structure, or lifted to a suitable position in a bucket-type truck or the like. The actuator means of the present invention includes an opening and closing wrench 62 having a vertical slot 64 extending from the top downward for a distance which is equal to the exposed length of the lead screw 32 as measured when the opening and closing mechanism 34 is in the fully down or lowermost position. The vertical slot extends completely across the diameter of the wrench 62. The wrench 62 includes near the top end 66, a horizontal groove 68 to receive the pilot pin 50 of the bottom of the lead screw 32 as previously described. The lower end of the wrench 62, i.e., the end 62 is pin connected to one end of an electrically, insulated elongated pole 70 of a 1¼ inch diameter. The other end of pole 70 includes a drive mechanism such as ½ inch square shank 72 which may be rotated or driven by a standard ½ inch drive torque wrench.

The installation of the housing 10 on the power line will now be explained. With the opening and closing mechanism 34 (and the lower jaw 30) in the lowermost or fully open position, tubular wrench 62 is inserted through the antenna sphere, which serves as a guide, and the wrench is rotated if necessary so the pilot pin 50 goes into slot 64. The wrench 62 is moved upwardly until the pin 50 bottoms out at the bottom of slot 64, and the weight of the housing 10 is thus supported on the wrench. The housing is moved onto the power line conductor and lowered so that the upper jaws rest on the conductor, thus transferring the weight of the housing to the conductor. Lowering the wrench 62 and continued rotation of the wrench 62 engages the pilot pin 50 within the horizontal groove 68. Thereafter, rotation of the wrench continues to advance the lead screw and thus advance the lower jaw toward the upper jaw until the conductor is securely clamped between the jaws. Then wrench 62 may be rotated in the opposite direction to disengage pin 50 from horizontal groove 68 to remove the wrench. It should be noted that when the pilot pin is locked in the horizontal groove, the weight of the electrically insulating pole 70 is not supported by the installer, and the slotted wrench cannot be accidentally disengaged or dropped from housing 10. The length of the electrically insulated pole 70 may, of course, vary depending upon the anticipated height of the transmission line above the ground or truck and the anticipated power line voltage. Of course the minimum length is dependent upon anticipated line voltage. The pole 70 should be made out of fiberglass or other material designed to withstand anticipated power line voltage.

The foregoing is a complete description of a preferred embodiment of the present invention. Numerous changes and modifications may be made without departing from the spirit and scope of the present invention. The present invention, therefore, should be limited only by the following claims.

What is claimed is:

1. In an overhead power line housing and antenna of the type adapted to engage a conductor and including at least one sensor, a transmitter energized by a power supply and an antenna operatively coupled to said transmitter, said conductor having an elongated axis, the improvement comprising:
    said housing having first, second and third spaced apart jaws with one jaw being movable in relation to the other jaws;
    said housing being essentially corona free;
    said first and second jaws being spaced apart in a first direction along the axis of said conductor and said third jaw being intermediate said first and second jaws in said first direction and spaced apart therefrom in a second direction such that upon engagement with said conductor, the conductor is biased in a concave orientation facing toward said third jaw relative to said other jaws; and
    means for moving said third jaw relative to said other jaws.

2. The invention as defined in claim 1 wherein said housing is C-shaped.

3. The invention as defined in claim 1 wherein said housing is C-shaped and said second jaw is positioned in the upper portion of said C-shaped housing.

4. The invention as defined in claim 1 wherein said third jaw is linearly movable toward and away from said second jaw.

5. The invention as defined in claim 1 wherein said first and second spaced apart jaws prevent rotation of the housing about any axis perpendicular to said axis of said conductor.

6. The invention as defined in claim 1 wherein each of said first and second jaws include curved recesses to receive and align said conductor.

7. The invention as defined in claim 1 wherein said antenna has a base grounded on the housing at the potential of said conductor.

8. The invention as defined in claim 1 wherein said antenna includes a guide for said jaw moving means.

9. The invention as defined in claim 1 wherein said antenna is a dipole antenna.

10. The invention as defined in claim 1 wherein said antenna is an essentially corona-free dipole antenna.

11. The invention is defined in claim 1 wherein said jaw moving means includes a lead screw operably coupled to said third jaw.

12. The invention as defined in claim 11 wherein said jaw moving means includes an actuator means removable from said housing.

13. The invention as defined in claim 12 wherein said actuator means includes an elongated tube having first and second slots, said first slot for rotating said lead screw and said second slot for preventing accidental disengagement between said elongated tube and said lead screw.

14. In an overhead power line housing and antenna of the type including at least one sensor, a transmitting energized by a power supply and an antenna operatively coupled to said transmitter, the improvement comprising:
    said housing having at least two, first and second spaced apart jaws and a third jaw being movable in relation to the first and second jaws;
    means for moving said third jaw;
    a pair of fixed spaced apart members each mounted to one of the first and second jaws and defining an open space between said first and second spaced apart members;
    whereby upon engagement with a conductor, the third jaw can be moved to clamp the conductor between the three jaws and bias the conductor into the open space between the spaced apart members; and
    said antenna being at the same electrical potential as said conductor.

15. The invention as defined in claim 14, wherein each of said jaws includes curved recesses to receive and align said conductor.

16. The invention as defined in claim 14, wherein said antenna includes a guide communicating with said jaw moving means; and
    an actuator means operable with said guide to operate said moving means and move said third jaw relative to said two jaws.

17. The invention as defined in claim 16 wherein said jaw moving means includes a lead screw operably coupled to said third jaw and adapted to operably receive said actuator means;
    said actuator means including an elongated tube having first and second slots, said first slot for rotating said lead screw and said second slot for preventing accidental disengagement between said elongated tube and said lead screw.

18. In an overhead power line housing and antenna of the type including at least one sensor, a transmitter energized by a power supply and an antenna operatively coupled to said transmitter, the improvement comprising:
    said housing having two spaced apart jaws with one jaw being movable in relation to the other jaw for clamping a conductor therebetween;
    moving means operatively interconnected to said one jaw for moving said one jaw in relation to said other jaw; and
    an actuator means for operating said moving means for moving said one jaw;
    said antenna being integral with said housing and having an opening therein which terminates at said moving means for receiving and guiding said actuator means when said actuator means is operating said moving means whereby upon engagement with a conductor the one jaw can be moved by said actuator means to clamp the conductor between the jaws.

19. The invention of claim 18, wherein said moving means includes a lead screw operably coupled to said one jaw and adapted to operably receive said actuator means;
    said actuator means including an elongated tube having first and second slots, said first slot for rotating said lead screw and said second slot for preventing accidental disengagement between said elongated tube and said lead screw.

* * * * *

UNITED STATES PATENT AND TRADEMARK OFFICE
CERTIFICATE OF CORRECTION

PATENT NO. : 4,827,272

DATED : May 2, 1989

INVENTOR(S) : Murray W. Davis

It is certified that error appears in the above-identified patent and that said Letters Patent is hereby corrected as shown below:

In claim 14, line 4, please delete the word "transmitting" and add --transmitter--.

Signed and Sealed this

Seventeenth Day of October, 1989

*Attest:*

DONALD J. QUIGG

*Attesting Officer*     *Commissioner of Patents and Trademarks*